(12) United States Patent
Kataoka

(10) Patent No.: US 10,224,958 B2
(45) Date of Patent: Mar. 5, 2019

(54) COMPUTER-READABLE RECORDING MEDIUM, ENCODING APPARATUS, AND ENCODING METHOD

(71) Applicant: FUJITSU LIMITED, Kawasaki-shi, Kanagawa (JP)

(72) Inventor: Masahiro Kataoka, Kamakura (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/711,149

(22) Filed: Sep. 21, 2017

(65) Prior Publication Data

US 2018/0102789 A1   Apr. 12, 2018

(30) Foreign Application Priority Data

Oct. 6, 2016   (JP) .................. 2016-198326

(51) Int. Cl.
*H03M 7/34*   (2006.01)
*H03M 7/46*   (2006.01)
*H03M 7/30*   (2006.01)

(52) U.S. Cl.
CPC ........... *H03M 7/46* (2013.01); *H03M 7/3086* (2013.01); *H03M 7/3088* (2013.01); *H03M 7/6011* (2013.01); *H03M 7/6017* (2013.01)

(58) Field of Classification Search
CPC .... H03M 7/3086; H03M 7/3088; H03M 7/46; H03M 7/6011; H03M 7/6017; H03M 7/4031; H03M 7/08; H03M 7/30; G06F 17/2205; G06F 17/2264; G06F 17/24; G06F 7/22
USPC ......................... 341/51, 65, 67, 87, 106, 107
See application file for complete search history.

(56) References Cited

U.S. PATENT DOCUMENTS

| | | | | | |
|---|---|---|---|---|---|
| 5,058,187 | A * | 10/1991 | Kim | ....................... | G06K 15/02 358/1.9 |
| 5,933,104 | A * | 8/1999 | Kimura | ............... | H03M 7/3086 341/51 |
| 6,191,711 | B1 * | 2/2001 | Smith | ..................... | H03M 7/30 341/50 |
| 6,369,723 | B1 * | 4/2002 | Pieterse | .................. | H03M 7/30 341/55 |
| 6,614,368 | B1 * | 9/2003 | Cooper | ............... | H03M 7/3084 341/106 |

(Continued)

FOREIGN PATENT DOCUMENTS

| | | |
|---|---|---|
| JP | 5-158652 | 6/1993 |
| JP | 7-64585 | 3/1995 |

(Continued)

OTHER PUBLICATIONS

Extended European Search Report dated Mar. 7, 2018 in Patent Application No. 17193131.4, citing documents AA and AO therein, 6 pages.

*Primary Examiner* — Linh Nguyen

(74) *Attorney, Agent, or Firm* — Oblon, McClelland, Maier & Neustadt, L.L.P.

(57) ABSTRACT

An encoding apparatus reads text data of an encoding target, encodes each character or word in the text data of the encoding target by using a bit map type index in which an appearance position is associated with each of the encoded characters or words, appearing on the text data of the encoding target, as bit map data, and updates the bit map type index with respect to the encoded character or word.

5 Claims, 9 Drawing Sheets

(56) References Cited

U.S. PATENT DOCUMENTS

| | | | | |
|---|---|---|---|---|
| 6,653,949 B1 * | 11/2003 | Cooper | ............... | H03M 7/3088 |
| | | | | 341/106 |
| 6,724,330 B1 * | 4/2004 | Cooper | ............... | H03M 7/3088 |
| | | | | 341/106 |
| 9,793,920 B1 * | 10/2017 | Kataoka | ................ | H03M 7/3084 |
| 9,928,559 B2 * | 3/2018 | Lahmi | .................... | G06T 1/0028 |
| 2007/0205925 A1 * | 9/2007 | Foster | ..................... | H03M 7/30 |
| | | | | 341/51 |
| 2008/0122665 A1 * | 5/2008 | Paris | ................... | G06F 12/0864 |
| | | | | 341/87 |
| 2017/0017619 A1 * | 1/2017 | Kataoka | .............. | G06F 17/2205 |

FOREIGN PATENT DOCUMENTS

| | | |
|---|---|---|
| JP | 10-283368 | 10/1998 |
| WO | WO 2013/095615 A1 | 6/2013 |

* cited by examiner

COMPUTER-READABLE RECORDING MEDIUM, ENCODING APPARATUS, AND ENCODING METHOD

CROSS-REFERENCE TO RELATED APPLICATION(S)

This application is based upon and claims the benefit of priority of the prior Japanese Patent Application No. 2016-198326, filed on Oct. 6, 2016, the entire contents of which are incorporated herein by reference.

FIELD

The embodiment discussed herein is related to an encoding program and the like.

BACKGROUND

ZIP using LZ77 is mainly used as a compression algorithm. In ZIP, longest coincidence searching is performed with respect to a character string of a compression target by using a slide window, and a compression code is generated. That is, in ZIP, in a case where there is a character string, which has been already subjected to compression encoding, and is identical to the character string of the compression target, in data stored in the slide window, compression is performed by representing the compression code with a relative address and a length from the slide window. The longest coincidence searching using the slide window is performed in byte unit.

Japanese Laid-open Patent Publication No. 10-283368
Japanese Laid-open Patent Publication No. 7-64585
Japanese Laid-open Patent Publication No. 5-158652

SUMMARY

According to an aspect of an embodiment, a non-transitory computer-readable recording medium has stored therein an encoding program. The encoding program causes a computer to execute a process. The process includes reading text data of an encoding target. The process includes encoding each character or word in the text data by using index information in which an appearance position is associated with each of the encoded characters or words, appearing on the text data, as bit map data. The process includes updating the index information with respect to the encoded character or word.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

In the technology of the longest coincidence searching using the slide window of the related art, it is difficult to improve a compression velocity and a compression ratio.

That is, in the longest coincidence searching using the slide window, the corresponding character or character string is stored in the slide window along with the compression encoding, and thus, the compression velocity decreases. In addition, the size of the slide window is limited to be less than or equal to a certain size such that longest coincidence searching time or a code length of the compression code does not become excessively long. For this reason, a character string overflowing from the slide window is excluded from the target of the longest coincidence, and thus, the compression ratio decreases. Further, in the longest coincidence searching, a collation with actual data stored in the slide window is sequentially performed, and thus, the compression velocity decreases.

Preferred embodiments of the present invention will be explained with reference to accompanying drawings. Furthermore, the present invention is not limited by the examples.

Encoding Processing According to Example

Figure 1:
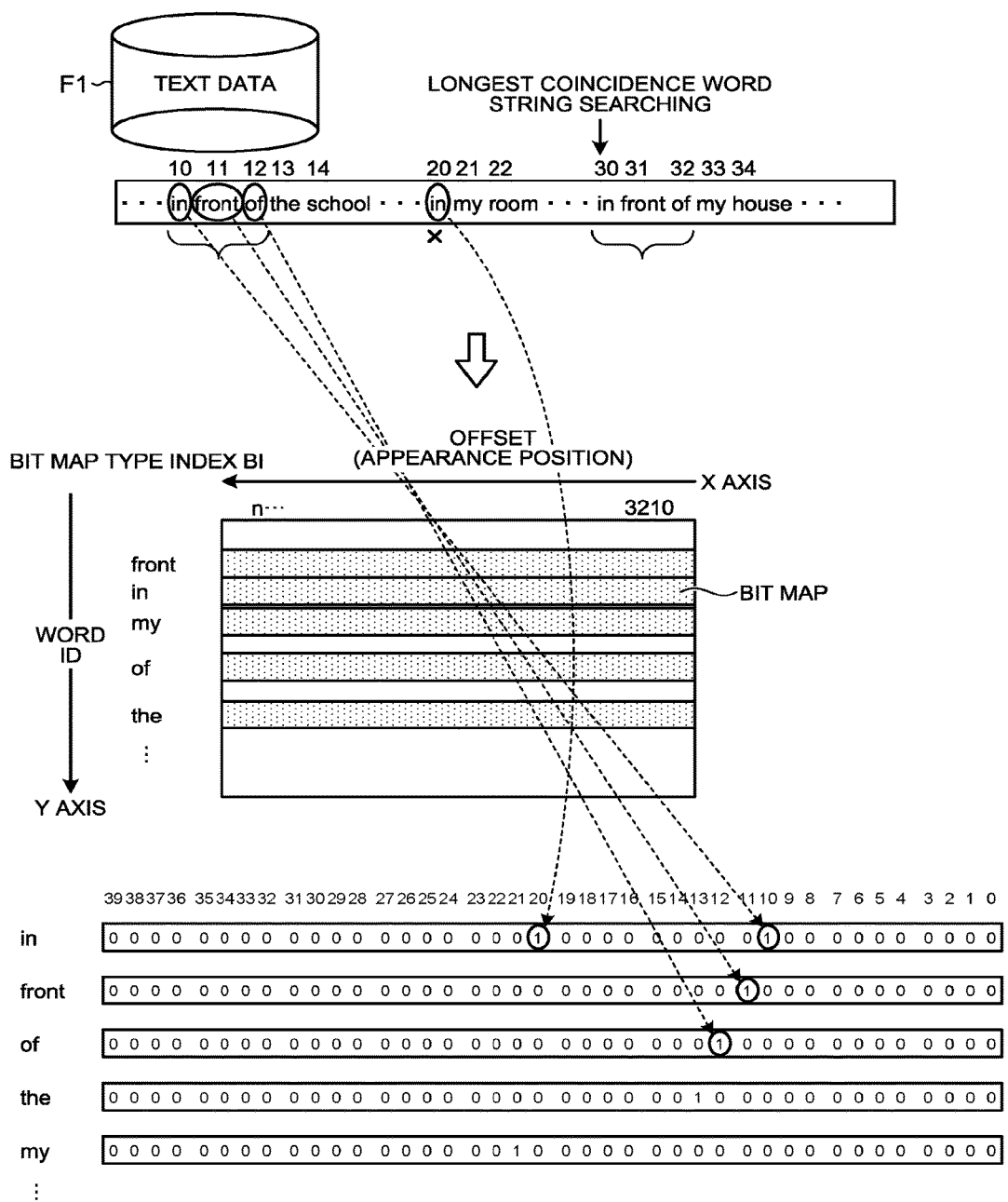
FIG. 1 is a first diagram illustrating an example of a flow of encoding processing according to an example.
Figure 2:
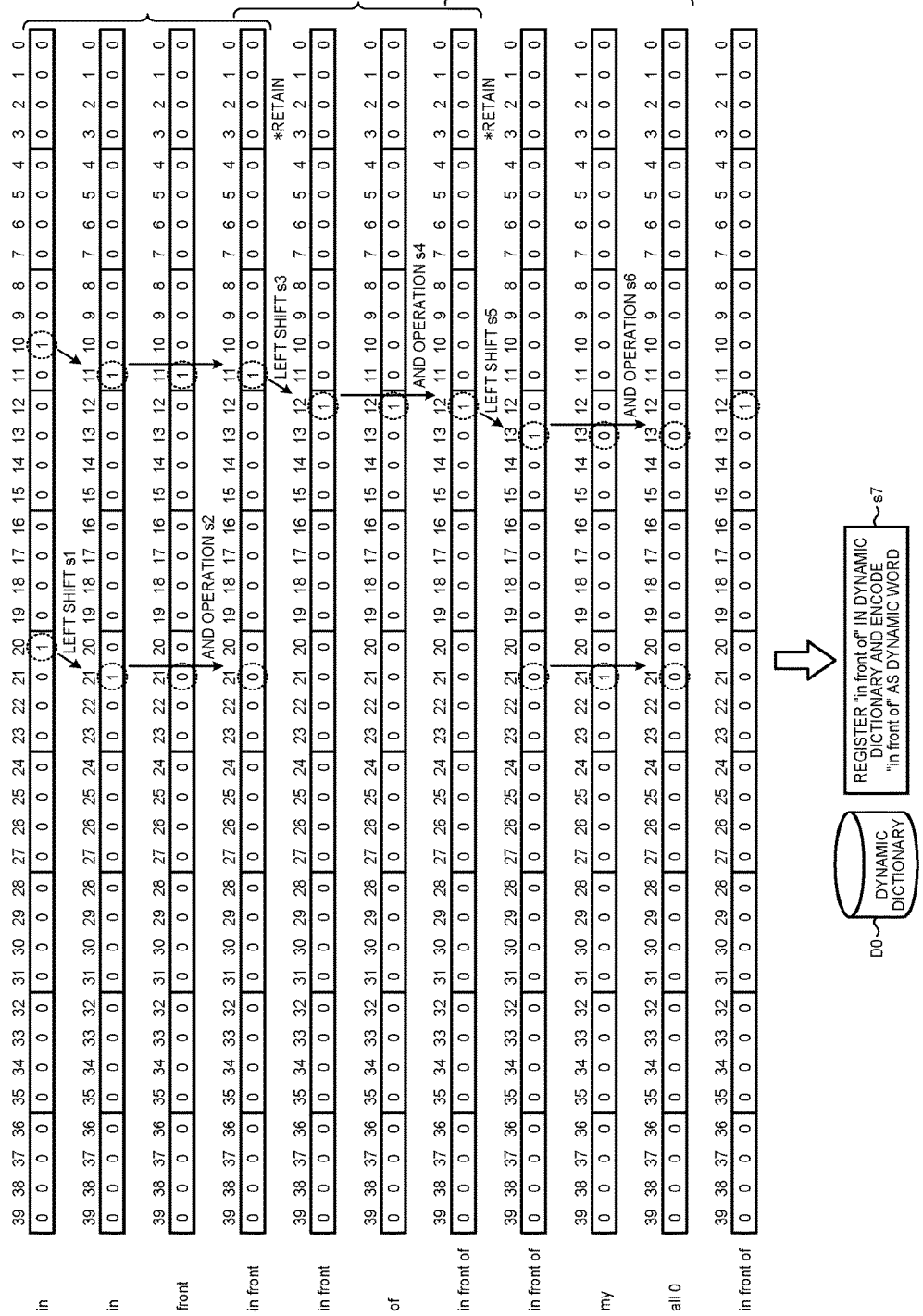
FIG. 2 is a second diagram illustrating an example of the flow of the encoding processing according to the example.

FIG. 1 and FIG. 2 are diagrams illustrating an example of a flow of encoding processing according to an example. As illustrated in FIG. 1 and FIG. 2, an encoding apparatus encodes each character of word in text data of an encoding target by using index information in which an appearance position is associated with each of the encoded characters or words appearing on the text data of the encoding target, as a bit map. That is, the encoding apparatus encodes a phrase such as continuous words, which repeatedly appear, by using the index information. Such index information is represented by a code BI, which is referred to as a "bit map type index". Furthermore, the character includes a word string. Hereinafter, the word string will be described as an example of the character.

Here, the bit map type index BI will be described. The bit map type index BI is a bit string in which a pointer designating a word or a word string included in the text data of the encoding target is coupled to a bit representing the presence or absence in each offset (each appearance position) in the text data of the word or the word string. That is, the bit map type index BI represents a bit map in which the presence or absence of each of the offsets (the appearance positions) is indexed with respect to the word or the word string included in the text data of the encoding target. As an example, in a case where the word or the word string is in the appearance position in the text data, ON is set as the presence or absence of the offset corresponding to the appearance position (the appearance position), that is, an appearance bit representing a binary digit of "1" is set. In a case where the word or the word string is not in the appearance position in the text data, OFF is set as the presence or absence of the offset corresponding to the appearance position (the appearance position), that is, a binary digit of "0" is set. For example, a word ID of the word or the word string is adopted as the pointer designating the word or the word string. The word ID may be the word or the word string itself, or may be a code of the word or the word string. The code of the word or the word string represents an encoded code, and corresponds to a static code and a dynamic code described below.

For example, as illustrated in FIG. 1, an X axis of the bit map type index BI represents the offset (the appearance position), and a Y axis represents the word ID. That is, each of the bit maps included in the bit map type index BI represents the presence or absence of each of the offsets (the appearance positions) of the word or the word string represented by the word ID.

Here, it will be described that n is 39. A word of "in" appears on a tenth position of text data F1 of the encoding target, and thus, ON is set in a tenth appearance position of a bit map corresponding to the word of "in", that is, the appearance bit representing the binary digit of "1" is set. A word of "front" appears on an eleventh position of the text data F1 of the encoding target, and thus, ON is set in an appearance position of an eleventh bit of a bit map corresponding to the word of "front", that is, the appearance bit representing the binary digit of "1" is set. A word of "of" appears on a twelfth position of the text data F1 of the encoding target, and thus, ON is set in an appearance position of a twelfth bit of a bit map corresponding to the word of "of", that is, the appearance bit representing the binary digit of "1" is set. A word of "in" appears on a twentieth position of the text data F1 of the encoding target, and thus, ON is set in an appearance position of a twentieth bit of a bit map corresponding to the word of "in", that is, the appearance bit representing the binary digit of "1" is set. Furthermore, whenever the word in the text data F1 is encoded, the appearance bit with respect to the bit map type index BI is set in the appearance position of the bit map corresponding to the word.

The encoding apparatus executes the searching processing of the longest coincidence word string with the encoded word or word string with respect to a continuous word string of the text data F1, with reference to such bit map type index BI. Here, the searching processing of the longest coincidence word string will be described by using a word string, which is continuous from "in" appearing in the thirtieth in the text data F1 an example.

For example, as illustrated in FIG. 2, the encoding apparatus shifts a bit map with respect to the current word of "in" appearing in the thirtieth in the text data F1 to the left by one bit (s1). Here, "1" is set to an eleventh bit and a twenty-first bit of the bit map. The encoding apparatus extracts a bit map with respect to the next word of "front" appearing in the thirty-first in the text data F1 from the bit map type index BI. The encoding apparatus performs an AND operation with respect to the bit map with respect to the current word of "in" and the extracted bit map with respect to the next word of "front" (s2). Then, the encoding apparatus determines whether or not all of the bits are "0" as the result of the operation. Here, the twenty-first bit of the bit map is calculated as "0", but the eleventh bit is calculated as "1", and thus, it is determined that not all of the bits are "0". That is, the encoding apparatus determines that the encoded word or word string is coincident with a word string of "in front" including the current word and the next word.

Next, the encoding apparatus shifts a bit map with respect to the current word string of "in front" to the left by one bit (s3). Here, "1" is set to a twelfth bit of the bit map. The encoding apparatus extracts a bit map with respect to the next word of "of" appearing in the thirty-second in the text data F1 from the bit map type index BI. The encoding apparatus performs the AND operation with respect to the bit map with respect to the current word string of "in front" and the extracted bit map with respect to the next word of "of" (s4). Then, encoding apparatus determines whether or not all of the bits are "0" as the result of the operation. Here, the twelfth bit of the bit map is calculated as "1", and thus, it is determined as not all of the bits are "0". That is, the encoding apparatus determines that the encoded word or word string is coincident with a word string of "in front of" including the current word string and the next word.

Next, the encoding apparatus shifts a bit map with respect to the current word string of "in front of" to the left by one bit (s5). Here, "1" is set to a thirteenth bit of the bit map. The encoding apparatus extracts a bit map with respect to the next word of "my" appearing in the thirty-third in the text data F1 from the bit map type index BI. Here, "1" is set to a twenty-first bit of the bit map. The encoding apparatus performs the AND operation with respect to the bit map with respect to the current word string of "in front of" and the extracted bit map with respect to the next word of "my" (s6). Then, the encoding apparatus determines whether or not all of the bits are "0" as the result of the operation. Here, any one of the thirteenth bit and the twenty-first bit of the bit map is calculated as "0", and thus, it is determined that all of the bits are "0". That is, the encoding apparatus determines that the encoded word or word string is not coincident with a word string of "in front of my" including the current word string and the next word. That is, "in front of", which is the current word string, is the longest coincidence word string.

Then, the encoding apparatus registers the current word string of "in front of" in a dynamic dictionary D0 in a case where the current word string of "in front of" is not registered in the dynamic dictionary D0, and encodes the current word string as a dynamic word (s7). The encoding apparatus outputs the encoded dynamic code as the encoded code. Furthermore, in a case where the current word string is registered in the dynamic dictionary D0, the encoding apparatus outputs the registered dynamic code as the encoded code. Then, the encoding apparatus sets the appearance bit in the appearance position of the word represented by the word ID, in the bit map with respect to the word ID, by using the dynamic code as the word ID. That is, the encoding apparatus sets the appearance bit in the appearance position of the bit map with respect to the word string of "in front of".

Then, the encoding apparatus outputs the encoded code, which is output, to encoded data of an encoded file.

Here, the dynamic dictionary D0 is a dictionary in which a word or a word string, which is not registered in a static dictionary, is associated with a dynamic code, which is dynamically assigned. Here, the word string is a coupled word, which is continuously coupled, and represents a word having a feature of repeatedly appearing in text data to be encoded. Examples of the word, which is not registered in the static dictionary, may include a word having a low appearance frequency (a low frequency word). Here, the word (the low frequency word) includes an expert word, a new word, an unknown word, and the like. The expert word is a word which is suitable for a specific academic discipline, business, or the like, and represents a word having a feature of repeatedly appearing in a document to be encoded. The new word is a word which is newly made, such as a vogue word, and represents a word having a feature of repeatedly appearing in a document to be encoded. The unknown word is a word which is neither the expert word nor the new word, and represents a word having a feature of repeatedly appearing in a document to be encoded. Furthermore, a word associated with the dynamic code is registered in the dynamic dictionary D0 in the buffer unit, in the order of the appearance of the word or the word string, which is not registered in the static dictionary. The dynamic dictionary D0 will be described below in detail.

Here, the static dictionary is a dictionary in which the appearance frequency of the word appearing in the document is specified on the basis of a general English dictionary, a general national language dictionary, a general text book, or the like, and a shorter code is allocated with respect to a word having a higher appearance frequency. A static code, which is a code corresponding to each of the words, is registered in the static dictionary in advance.

Example of Dynamic Dictionary

Figure 3:
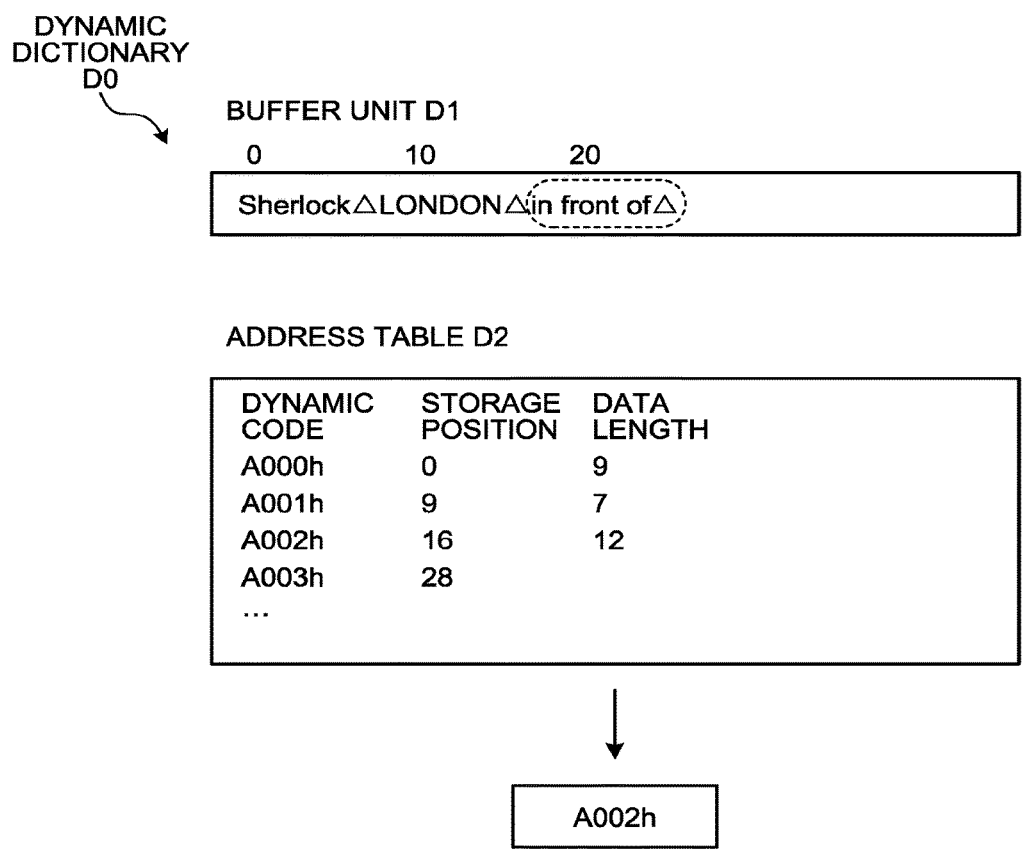
FIG. 3 is a diagram illustrating an example of a dynamic dictionary according to the example.

FIG. 3 is a diagram illustrating an example of the dynamic dictionary according to the example. The dynamic dictionary D0 illustrated in FIG. 3 includes a buffer unit D1 and an address table D2. The buffer unit D1 stores a character string. The address table D2 retains a dynamic code, a storage position, and a data length in association with each other. The dynamic code is a code having a fixed length which is set in advance, and for example, is a compression code. Then, the dynamic code is allocated in the order where the character string of the word or word string is registered. Here, the dynamic code is a code of two bytes having a fixed length started from a hexadecimal number of "A". The storage position represents the position of the character string which is stored in the buffer unit D1. The data length represents the length of the character string (a byte length) which is stored in the buffer unit D1.

For example, a case will be described in which a dynamic code is allocated to a word string of "in front of Δ". Furthermore, "Δ" represents a blank. The encoding apparatus stores the word string of "in front of Δ" in the buffer unit D1. The encoding apparatus registers the storage position in which the word string is stored and the data length in the address table D2. Here, the encoding apparatus registers "16" as the storage position and "12" as the data length in the address table D2. The encoding apparatus allocates the dynamic code of the address table D2 associated with the word string as the encoded code. Here, the encoding apparatus allocates a dynamic code of "A002h" associated with the word string of "in front of Δ" as the encoded code.

Configuration Example of Encoded File

Figure 4:
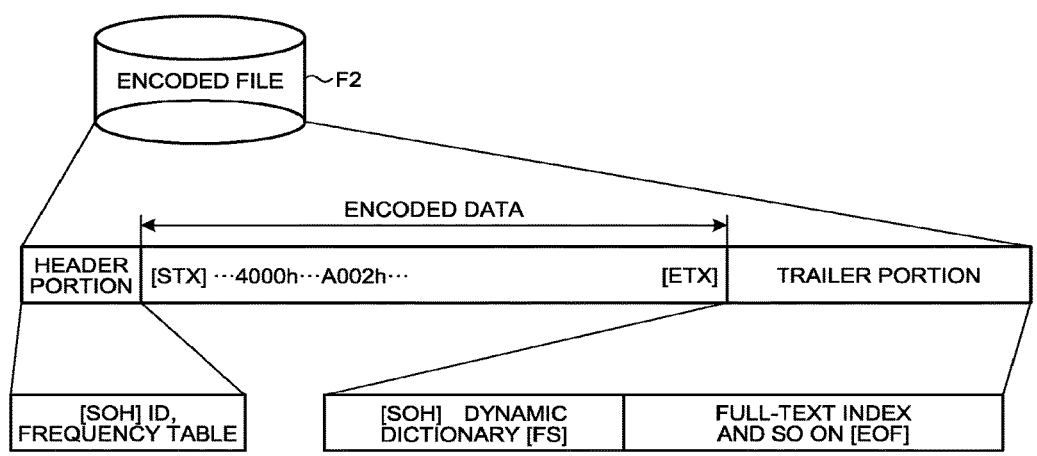
FIG. 4 is a diagram illustrating a configuration example of an encoded file according to the example.

FIG. 4 is a diagram illustrating a configuration example of the encoded file according to the example. As illustrated in FIG. 4, an encoded file F2 includes a header portion, encoded data, and a trailer portion. An encoded code group of the text data F1 is stored in the encoded data. The information of the dynamic dictionary D0 after the encoding processing is completed, the bit map type index BI, and the like are stored in the trailer portion. The information of the dynamic dictionary D0 corresponds to the information of the dynamic dictionary illustrated in FIG. 3. For example, information identifying an encoding algorithm used for generating the encoded file F2, information such as a parameter used for the encoding, and the like are stored in the header portion, and for example, a pointer and the like with respect to the dynamic dictionary D0 stored in the trailer portion are stored in the header portion. Furthermore, it is described that the bit map type index BI is stored in the trailer portion, but there is a case where the bit map type index BI is not stored in the trailer portion.

Configuration of Encoding Apparatus According to Example

Figure 5:
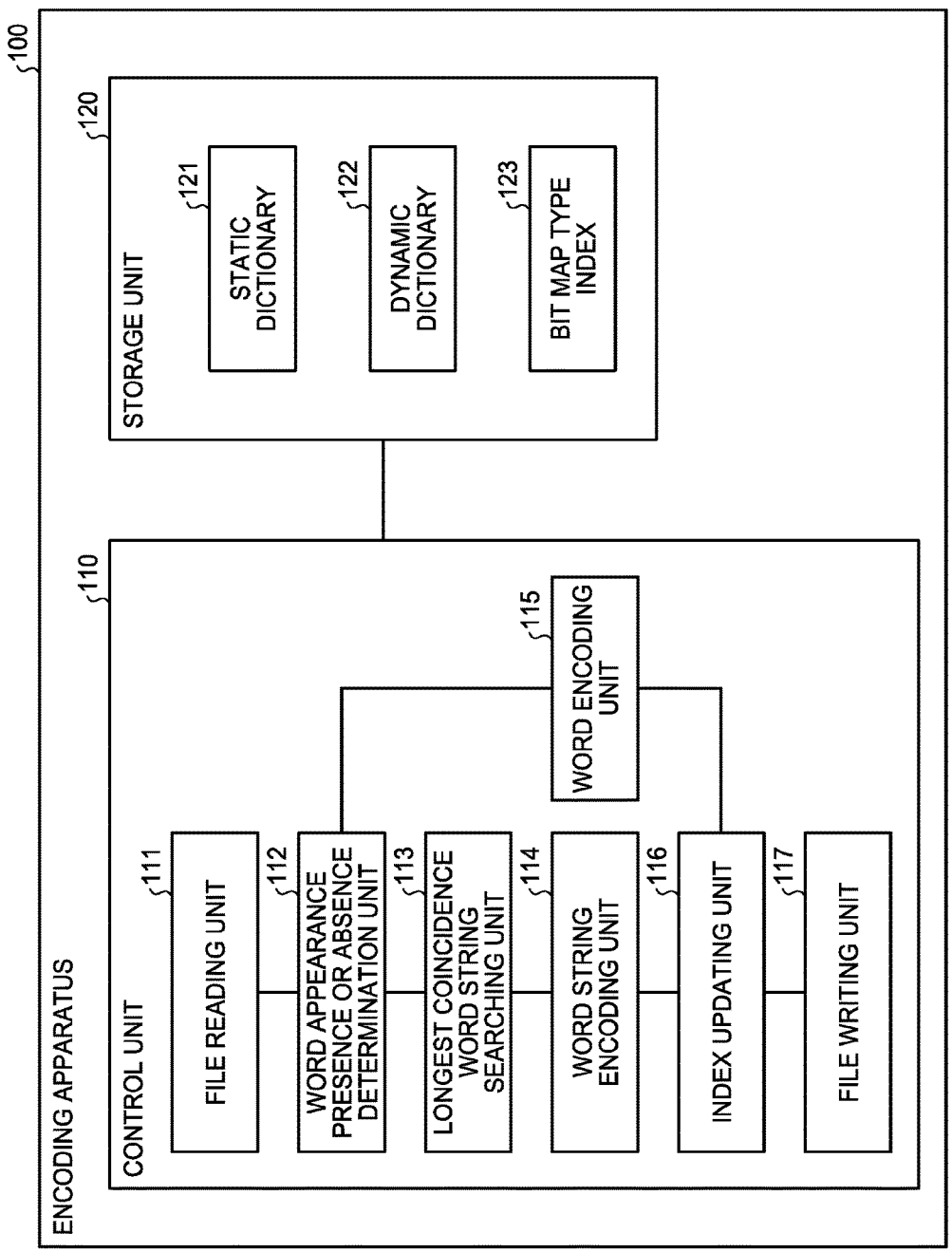
FIG. 5 is a functional block diagram illustrating an example of a configuration of an encoding apparatus according to the example.

FIG. 5 is a functional block diagram illustrating an example of the configuration of the encoding apparatus according to the example. As illustrated in FIG. 5, an encoding apparatus 100 includes a control unit 110 and a storage unit 120.

The control unit 110 is a processing unit executing the encoding processing illustrated in FIG. 1 and FIG. 2. The control unit 110 includes a file reading unit 111, a word appearance presence or absence determination unit 112, a longest coincidence word string searching unit 113, a word string encoding unit 114, a word encoding unit 115, an index updating unit 116, and a file writing unit 117.

The storage unit 120, for example, corresponds to a storage apparatus, for example, a non-volatile semiconductor memory element such as a flash memory or a ferroelectric random access memory (FRAM: Registered Trademark). The storage unit 120 includes a static dictionary 121, a dynamic dictionary 122, and a bit map type index 123.

The static dictionary 121 is a dictionary in which an appearance frequency of a word appearing in a document is specified on the basis of a general English dictionary, a general national language dictionary, a general text book, or the like, and a shorter code is allocated with respect to a word having a higher appearance frequency. A static code, which is a code corresponding to each of the words, is registered in the static dictionary 121 in advance.

The dynamic dictionary 122 is a dictionary in which a word and a word string, which are not registered in the static dictionary 121, are associated with a dynamic code, which is dynamically assigned. Furthermore, the dynamic dictionary 122 is corresponding to the dynamic dictionary D0. The description of the dynamic dictionary 122 is identical to that of FIG. 3, and thus, will be omitted.

The bit map type index 123 is an assembly of bit maps in which the presence or absence of each offset (each appearance position) is indexed with respect to a word or a word string included in text data. Furthermore, the bit map type index 123 corresponds to the bit map type index BI. The description of the bit map type index 123 is identical to that of FIG. 1, and thus, will be omitted.

The control unit 110 includes a file reading unit 111, a word appearance presence or absence determination unit 112, a longest coincidence word string searching unit 113, a word string encoding unit 114, a word encoding unit 115, an index updating unit 116, and a file writing unit 117.

The file reading unit 111 reads out the file of the encoding target in a storage region. The file reading unit 111 reads out the text data F1 from the storage region, and performs lexical analysis with respect to the read text data F1. The file reading unit 111 sequentially outputs each word of the result of the lexical analysis to the word appearance presence or absence determination unit 112.

The word appearance presence or absence determination unit 112 determines the presence or absence of the appearance of the word by using a bit map with respect to the word. For example, the word appearance presence or absence determination unit 112 acquires the word ID corresponding to the word from the static dictionary 121. The word appearance presence or absence determination unit 112 extracts a bit map with respect to the acquired word ID from the bit map type index 123. Then, the word appearance presence or absence determination unit 112 determines whether or not an appearance bit is set in the extracted bit map.

In a case where the appearance bit is set in the bit map with respect to the word, the longest coincidence word string searching unit 113 performs longest coincidence searching with the encoded word or word string with respect to a word string including the next word. For example, the longest coincidence word string searching unit 113 shifts a bit map with respect to the currently processed word or word string to the left by one bit. The longest coincidence word string searching unit 113 extracts a bit map with respect to the next word from the bit map type index 123. The longest coincidence word string searching unit 113 performs an AND operation with respect to the bit map with respect to the currently processed word or word string and the bit map with respect to the next word. Then, the longest coincidence word string searching unit 113 determines whether or not all of the bits of the bit map are "0" as the result of the operation. In a case where not all of the bits of the bit map are "0", the longest coincidence word string searching unit 113 determines that the encoded word or word string is coincident with a word string including the currently processed word or word string and the next word. Then, the longest coincidence word string searching unit 113 further performs the longest coincidence searching with the encoded word or word string with respect to the word string including the next word. In a case where all of the bits of the bit map are "0", the longest coincidence word string searching unit 113 determines that the encoded word or word string is not coincident with the word string including the currently processed word or word string and the next word. As a result thereof, in a case where the currently processed word or word string is a word string, the word string is the longest coincidence word string.

The word string encoding unit 114 encodes the longest coincidence word string. For example, the word string encoding unit 114 determines whether or not the longest coincidence word string is registered in the dynamic dictionary 122. In a case where the longest coincidence word string is not registered in the dynamic dictionary 122, the word string encoding unit 114 registers the word string in the dynamic dictionary 122, and allocates a dynamic code to the word string. As an example, the word string encoding unit 114 stores the longest coincidence word string in the buffer unit D1, and stores a storage position in which the word string is stored and a data length in a record corresponding to a new dynamic code of the address table D2. The word string encoding unit 114 encodes the word string to the new dynamic code. Furthermore, in a case where the longest coincidence word string is registered in the dynamic dictionary 122, the word string encoding unit 114 encodes the word string to the registered dynamic code. Then, the word string encoding unit 114 outputs the encoded dynamic code and the appearance position in the text data F1 to the index updating unit 116.

The word encoding unit 115 encodes the word. For example, in a case where the appearance bit does not appear on the bit map with respect to the word, the word encoding unit 115 encodes the word to the static code registered in the static dictionary 121. Then, the word encoding unit 115 outputs the encoded static code and the appearance position in the text data F1 to the index updating unit 116.

The index updating unit 116 updates the bit map type index 123. For example, the index updating unit 116 sets an appearance bit in an appearance position of a bit map with respect to the dynamic code by using the dynamic code and the appearance position in the text data F1, which are output from the word string encoding unit 114. The index updating unit 116 sets an appearance bit in an appearance position of a bit map with respect to the static code by using the static code and the appearance position in the text data F1, which are output from the word encoding unit 115.

The file writing unit 117 encodes the entire text data F1 in the file of the encoding target, and then, stores each of the encoded codes in the encoded data of the encoded file F2. The file writing unit 117 writes the information of the dynamic dictionary 122 and the bit map type index 123 in the trailer portion of the encoded file F2.

Processing Procedure of Encoding Processing According to Example

Figure 6:
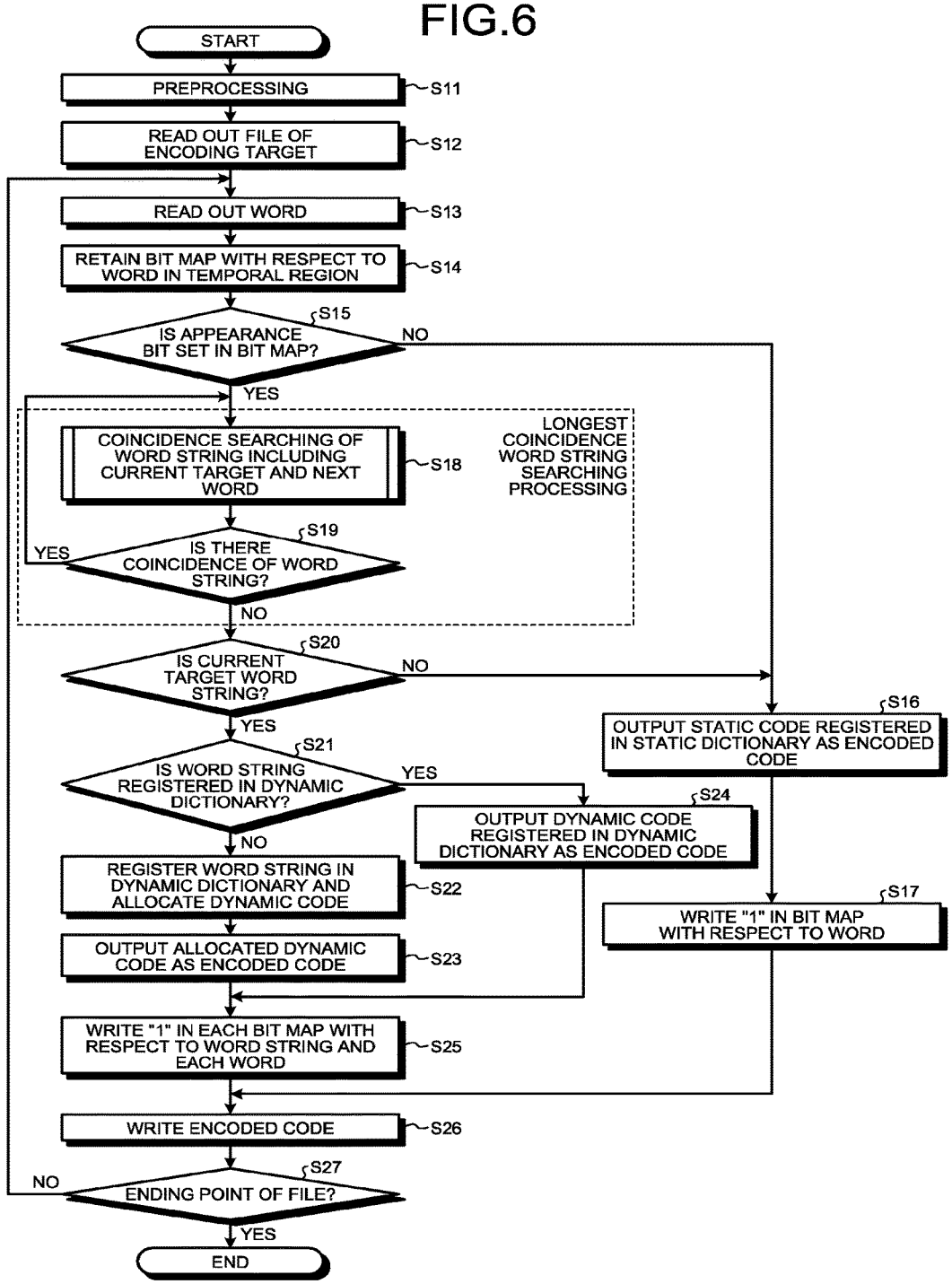
FIG. 6 is a diagram illustrating an example of a flowchart of the encoding processing according to the example.

Next, a processing procedure of the control unit 110 illustrated in FIG. 5 will be described with reference to FIG. 6. FIG. 6 is a diagram illustrating an example of a flowchart of the encoding processing according to the example.

As illustrated in FIG. 6, the control unit 110 executes preprocessing (Step S11). For example, the control unit 110 ensures various storage regions in the storage unit 120. Then, the control unit 110 reads out the file of the encoding target, and stores the text data F1 in a storage region for reading (Step S12).

Then, the control unit 110 reads out a word from the storage region for reading (Step S13). The control unit 110 retains a bit map with respect to the read word in a temporal region (Step S14). For example, the control unit 110 acquires a static code with respect to the word from the static dictionary 121 as the word ID. The control unit 110 extracts a bit map with respect to the word ID from the bit map type index 123, and retains the extracted bit map in a temporal storage region.

The control unit 110 determines whether or not an appearance bit is set in the bit map with respect to the word (Step S15). In a case where it is determined the appearance bit is not set in the bit map with respect to the word (Step S15; No), the control unit 110 outputs the static code registered in the static dictionary 121 as the encoded code (Step S16). Then, the control unit 110 writes "1" (an appearance bit) in an appearance position of the bit map with respect to the word by using the static code of the word and the appearance position in the text data F1 (Step S17). Then, the control unit 110 allows the process to proceed to Step S26.

On the other hand, in a case where it is determined that the appearance bit is set in the bit map with respect to the word (Step S15; Yes), the control unit 110 executes coincidence searching of a word string including a current target (a word or a word string) and the next word (Step S18). Furthermore, a flowchart of the coincidence searching processing of the word string will be described below.

As a result of executing the coincidence searching, the control unit 110 determines whether or not there is a coincidence word string (Step S19). In a case where it is determined that there is the coincidence word string (Step S19; Yes), the control unit 110 allows the process to proceed to Step S18 in order to execute the coincidence searching of the word string including the next word.

On the other hand, in a case where it is determined that there is no coincidence word string (Step S19; No), the control unit 110 determines whether or not the current target (the word or the word string) is a word string (Step S20). In a case where it is determined that the current target is not the word string (Step S20; No), the control unit 110 allows the process to proceed to Step S16 in order to encode the current target to a static code.

On the other hand, in a case where it is determined that the current target is the word string (Step S20; Yes), the control unit 110 determines whether or not the word string is registered in the dynamic dictionary 122 (Step S21). In a case where it is determined that the word string is not registered in the dynamic dictionary 122 (Step S21; No), the control unit 110 registers the word string in the dynamic dictionary 122, and allocates a dynamic code to the word string (Step S22). The control unit 110 outputs the allocated dynamic code as the encoded code (Step S23). Then, the control unit 110 allows the process to proceed to Step S25.

On the other hand, in a case where it is determined that the word string is registered in the dynamic dictionary 122 (Step S21; Yes), the control unit 110 outputs the dynamic code registered in the dynamic dictionary 122 as the encoded code (Step S24). Then, the control unit 110 allows the process to proceed to Step S25.

In Step S25, the control unit 110 writes "1" in each of the bit maps with respect to the word string and each of the words (Step S25). For example, the control unit 110 writes "1" (the appearance bit) in the appearance position of the bit map with respect to the word string for the word string, by using the dynamic code and the appearance position in the text data F1. Then, the control unit 110 writes "1" (the appearance bit) in the appearance position of the bit map with respect to word for each of the words used at the time of executing searching of the longest coincidence word string, by using the static code and the appearance position in the text data F1. Then, the control unit 110 allows the process to proceed to Step S26.

In Step S26, the control unit 110 writes the encoded code in the encoded data of the encoded file F2 (Step S26). Then, the control unit 110 determines whether or not it is an ending point of the file (Step S27). In a case where it is determined that it is not the ending point of the file (Step S27; No), the control unit 110 allows the process to proceed to Step S13 in order to read out the next word.

On the other hand, in a case where it is determined that it is the ending point of the file (Step S27; Yes), the control unit 110 ends the encoding processing.

Figure 7:
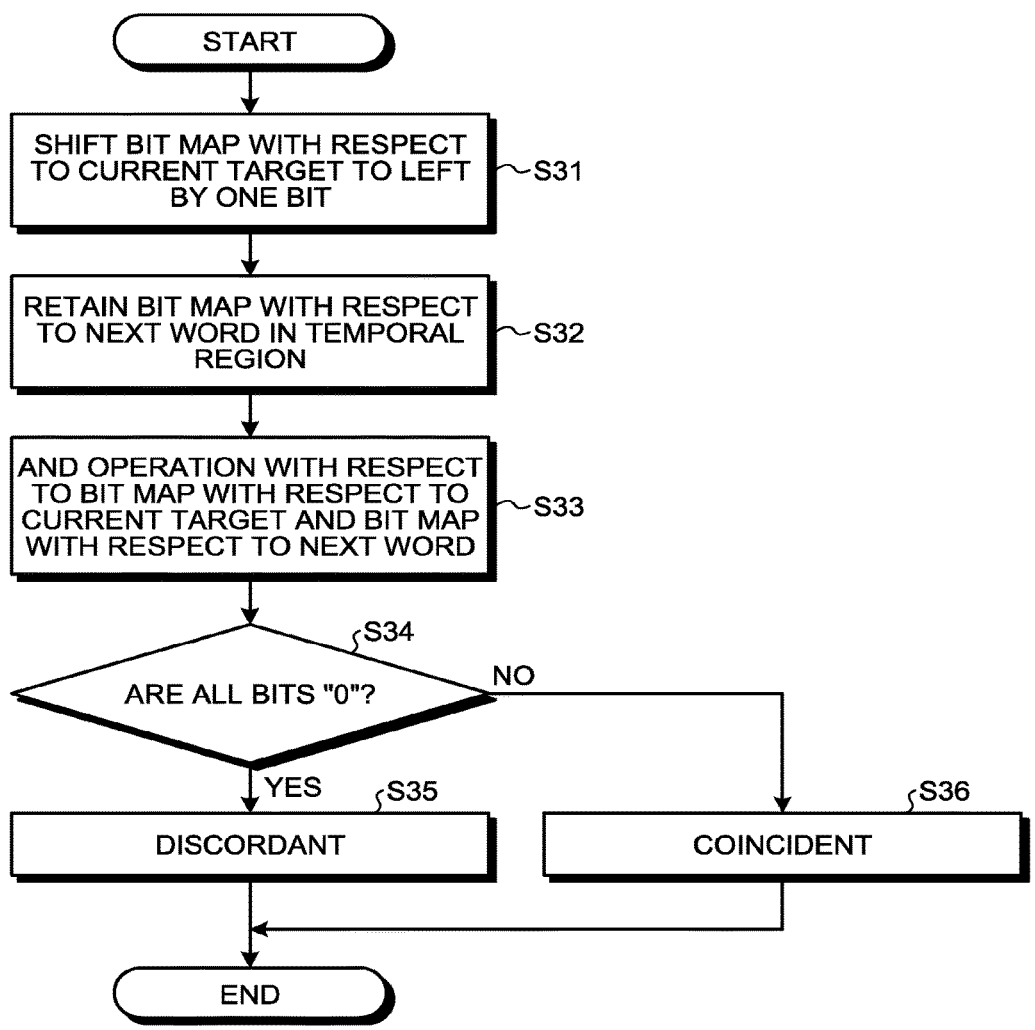
FIG. 7 is a diagram illustrating an example of a flowchart of coincidence searching processing of the word string according to the example.

Processing Procedure of Coincidence Searching Processing of Word String According to Example FIG. 7 is a diagram illustrating an example of a flowchart of coincidence searching processing of the word string according to the example.

As illustrated in FIG. 7, the control unit 110 shifts a bit map with respect to the current target (the word or the word string) to the left by one bit (Step S31). The control unit 110 retains a bit map with respect to the next word in the temporal region (Step S32). Then, the control unit 110 performs an AND operation with respect to the bit map with respect to the current target and the bit map with respect to the next word (Step S33).

The control unit 110 determines whether or not all of the bits of the bit map representing the result of the AND operation are "0" (Step S34). In a case where it is determined that all of the bits are "0" (Step S34; Yes), the control unit 110 determines that there is no coincidence word string including the current target and the next word (Step S35). That is, the control unit 110 determines that the word string including the current target and the next word is not coincident with the encoded word or word string. Then, the control unit 110 ends the coincidence searching processing of the word string.

On the other hand, in a case where it is determined that not all of the bits are "0" (Step S34; No), the control unit 110 determines that there is the coincidence word string including the current target and the next word (Step S36). That is, the control unit 110 determines the word string including the current target and the next word is coincident with the encoded word or word string. Then, the control unit 110 ends the coincidence searching processing of the word string.

Accordingly, the encoding apparatus 100 reads the text data F1 of the encoding target, and encodes each of the characters or the words of the text data F1 of the encoding target by using the bit map type index 123. The bit map type index 123 is index information in which an appearance position is associated with each of the encoded characters or words, appearing on the text data F1 of the encoding target, as bit map data. The encoding apparatus 100 updates the bit map type index BI with respect to the encoded character or word simultaneously with the encoding. According to such a configuration, the encoding apparatus 100 is capable of performing longest coincidence with respect to the encoded character or word by using the bit map type index 123, but not longest coincidence with respect to a limited range as with a method using a slide window such as LZ77. As a result thereof, the encoding apparatus 100 is capable of improving a compression ratio compared to the method using the slide window. In addition, the encoding apparatus 100 is capable of determining the longest coincidence with reference to the bit by using the bit map type index 123, but not with reference to the actual text data. As a result thereof, the encoding apparatus 100 is capable of improving a compression velocity compared to the method using the slide window.

In addition, the encoding apparatus 100 performs the longest coincidence searching with the encoded character or word with respect to the continuous characters or words of the text data F1 of the encoding target, with reference to the bit map type index 123. The encoding apparatus 100 registers the coincident character string of word string of the longest coincidence searching in the dynamic dictionary 122, and encodes the coincident character string of word string. According to such a configuration, the encoding apparatus 100 is capable of improving the compression ratio compared to the method using the slide window. That is, the encoding apparatus 100 is capable of performing the longest coincidence searching by using all of the encoded data items as a target, with reference to the bit map type index 123, and is capable of improving the compression ratio.

In addition, the encoding apparatus 100 performs the longest coincidence searching with the encoded character or word with respect to the continuous characters or words of the text data F1 of the encoding target with reference to the bit map type index 123, without collating with the text data F1, which is actual data. The encoding apparatus 100 registers the coincident character string or word string of the longest coincidence searching in the dynamic dictionary 122, and encodes the coincident character string or word string on the basis of the dynamic code associated with the registered character string or word string. According to such a configuration, the encoding apparatus 100 does not collate with the actual data, and thus, is capable of improving the compression velocity or the compression ratio compared to the method using the slide window.

Other Aspects Relevant to Example

Hereinafter, a part of a modification example of the embodiment described above will be described. Not only the modification example described below but also design modifications within the range not departing from the gist of the present invention are suitably performed.

In addition, in the example, it has been described that the encoding apparatus 100 executes the searching processing of the longest coincidence word string with the encoded word or word string with respect to the continuous word strings in the text data F1, with reference to the bit map type index 123. However, the encoding apparatus 100 may execute the searching processing of the longest coincidence word string with respect to the continuous word strings in the text data F1, with reference to a hashed index in which the bit map type index 123 is hashed with respect to each of the bit maps, instead of the bit map type index 123. In such a case, the encoding apparatus 100 may decompress a hashed bit map which corresponds to a word or a word string in the hashed index, which is a target, and may execute the searching processing of the longest coincidence word string with respect to the decompressed bit map. Accordingly, even in a case where there are a few resources to be used at the time of performing the encoding, the encoding apparatus 100 is capable of performing the encoding with the few resources.

In addition, the processing procedure, the control procedure, the specific name, and the information including various data items or parameters, described in the example, can be arbitrarily changed unless otherwise specified.

Hardware Configuration of Information Processing Apparatus

Figure 8:
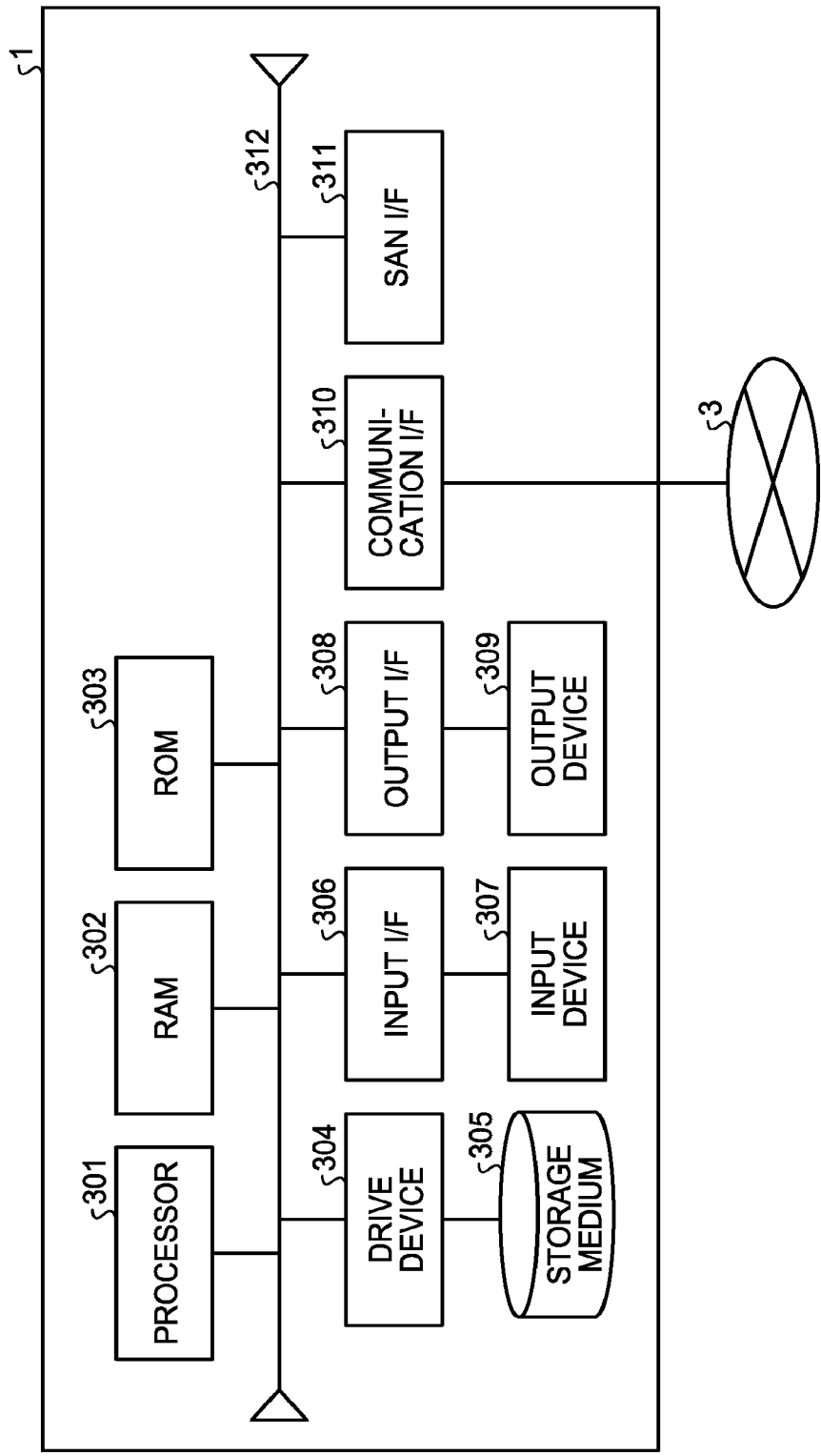
FIG. 8 is a diagram illustrating a hardware configuration example of a computer.

In the following description, hardware and software to be used in the embodiment described above will be described. FIG. 8 is a diagram illustrating a hardware configuration example of a computer 1. The computer 1, for example, includes a processor 301, a random access memory (RAM) 302, a read only memory (ROM) 303, a drive device 304, a storage medium 305, an input interface (I/F) 306, an input device 307, an output interface (I/F) 308, an output device 309, a communication interface (I/F) 310, a storage area network (SAN) interface (I/F) 311, a bus 312, and the like. The respective hardwares are connected to each other through the bus 312.

The RAM 302 is a readable and writable memory device, and examples of the RAM 302 include a semiconductor memory such as a static RAM (SRAM) or a dynamic RAM (DRAM), a flash memory instead of the RAM, and the like. The ROM 303 includes a programmable ROM (PROM) and the like. The drive device 304 is an apparatus performing at least one of reading or writing with respect to information recorded in the storage medium 305. The storage medium 305 stores the information written by the drive device 304. The storage medium 305, for example, is a storage medium such as a hard disk, a flash memory such as a solid state drive (SSD), a compact disc (CD), a digital versatile disc (DVD), a Blu-ray disc. In addition, for example, in the computer 1, the drive device 304 and the storage medium 305 are provided with respect to each of a plurality of types of storage mediums.

The input interface 306 is a circuit which is connected to the input device 307, and transmits an input signal received from the input device 307 to the processor 301. The output interface 308 is a circuit which is connected to the output device 309, and allows the output device 309 to execute output according to an instruction of the processor 301. The communication interface 310 is a circuit which controls communication through a network 3. The communication interface 310, for example, is a network interface card (NIC) and the like. The SAN interface 311 is a circuit which controls communication with the storage apparatus connected to the computer 1 through the storage area network. The SAN interface 311, for example, is a host bus adapter (HBA) and the like.

The input device 307 is an apparatus which transmits an input signal according to a manipulation. The input signal, for example, is a pointing device such as a key apparatus such as keyboard or a button attached onto the main body of the computer 1, a mouse, or a touch panel. The output device 309 is an apparatus which outputs information according to the control of the computer 1. The output device 309, for example, is an image output apparatus (a display device) such as a display, a sound output apparatus such as a speaker, or the like. In addition, for example, an input and output apparatus such as a touch screen is used as the input device 307 and the output device 309. In addition, the input device 307 and the output device 309 may be integrated with the computer 1, or may be, for example, an apparatus which is connected to the computer 1 from the outside without being included in the computer 1.

For example, the processor 301 reads out a program stored in the ROM 303 or the storage medium 305 to the RAM 302, and performs the processing of the control unit 110 according to the procedure of the read program. At this time, the RAM 302 is used as a work area of the processor 301. The ROM 303 and the storage medium 305 store a program file (an application program 24, middleware 23, an OS 22, and the like, described below) or a data file (for example, the static dictionary 121, the dynamic dictionary 122, the bit map type index 123, and the like), and the RAM 302 is used as the work area of the processor 301, and thus, the function of the storage unit 120 is realized. The program read by the processor 301 will be described by using FIG. 9.

Figure 9:
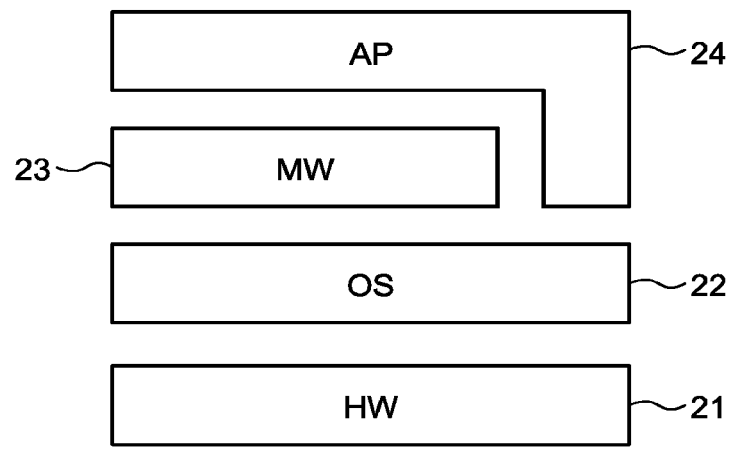
FIG. 9 is a diagram illustrating a configuration example of a program operated by the computer.

FIG. 9 is a diagram illustrating a configuration example of the program which is operated in the computer. An operating system (OS) 22 controlling a hardware group (HW) 21 (301 to 312) illustrated in FIG. 9 is operated in the computer 1. The processor 301 is operated in the procedure according to the OS 22, and the hardware group (HW) 21 is controlled and managed, and thus, the processing according to the application program (AP) 24 or the middleware (MW) 23 is executed by the hardware group 21. Further, in the computer 1, the middleware (MW) 23 or the application program (AP) 24 is read in the RAM 302, and is executed by the processor 301.

In a case where an encoding function is called, the processor 301 performs the processing based on at least a part of the middleware 23 or the application program 24, (the hardware group 21 is controlled by the processing on the basis of the OS 22), and thus, the function of the control unit 110 is realized. The encoding function may be included in the application program 24 itself, or may be a part of the middleware 23 which is executed by being called according to the application program 24.

Figure 10:
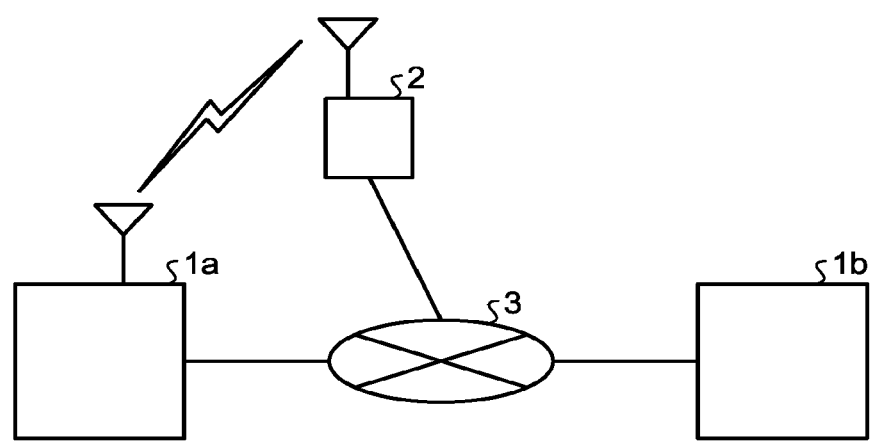
FIG. 10 is a diagram illustrating a configuration example of an apparatus in a system of an embodiment.

FIG. 10 illustrates a configuration example of an apparatus of a system of the embodiment. The system of FIG. 10 includes a computer 1a, a computer 1b, a base station 2, and a network 3. The computer 1a is connected to the network 3 which is connected to the computer 1b at least in a wireless manner or a wired manner.

The encoding apparatus 100 illustrated in FIG. 5 and a decoding apparatus (not illustrated) may be included in any one of the computer 1a and the computer 1b illustrated in FIG. 10. The computer 1b may have the function of the encoding apparatus 100, the computer 1a may have the function of the decoding apparatus, or the computer 1a may have the function of the encoding apparatus 100, and the computer 1b may have the function of the decoding apparatus. In addition, both the computer 1a and the computer 1b may have the function of the encoding apparatus 100 and the function of the decoding apparatus.

According to one aspect, it is possible to improve a compression velocity and a compression ratio, in a case where a character string or a word string is encoded by using longest coincidence searching.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium having stored therein an encoding program that causes a computer to execute a process comprising:
    reading text data of an encoding target;
    determining appearance positions of each word in the text data as a two-dimensional bitmap in which each row corresponds to a word of the text data and each column corresponds to a position in the text data, the appearance position of each word being indicated by an index value at an intersection of a corresponding row and column of the bitmap,
    determining strings of words in the text data by shifting a row relative to a subsequent row and performing an AND operation between index values in each column of the row and the subsequent row to determine columns that result in non-zero values of the AND operation, the columns that result in non-zero values indicating that a word corresponding to the row and a word corresponding to the subsequent row appear as a string of words at positions corresponding to the columns that result in non-zero values,
    encoding each character or word in the text data by using results of the determining of the appearance positions and the determining of the strings of words; and
    updating index values in the two-dimensional bitmap based on the encoded character or word.

2. The non-transitory computer-readable recording medium according to claim 1, wherein the encoding includes searching longest coincidence with the encoded character or word with respect to continuous characters or words in the text data with reference to the index value, and registering a coincident character string or word string coincided by the longest coincidence searching in a dynamic dictionary and encoding the coincident character string or word string.

3. The non-transitory computer-readable recording medium according to claim 2, wherein the encoding includes searching longest coincidence with the encoded character or word with respect to continuous characters or words in the text data with reference to the index value without collating with the text data, and registering the coincident character string or word string coincided by the longest coincidence searching in the dynamic dictionary and encoding the coincident character string or word string on the basis of a dynamic code associated with the registered character string or word string.

4. An encoding apparatus comprising:
    a processor;
    a memory, wherein the processor executes a process comprising:
    reading text data of an encoding target;
    determining appearance positions of each word in the text data as a two-dimensional bitmap in which each row corresponds to a word of the text data and each column corresponds to a position in the text data, the appearance position of each word being indicated by an index value at an intersection of a corresponding row and column of the bitmap;
    determining strings of words in the text data by shifting a row relative to a subsequent row and performing an AND operation between index values in each column of the row and the subsequent row to determine columns that result in non-zero values of the AND operation, the columns that result in non-zero values indicating that a word corresponding to the row and a word corresponding to the subsequent row appear as a string of words at positions corresponding to the columns that result in non-zero values;
    encoding each character or word in the text data by using results of the determining of the appearance positions and the determining of the strings of words; and
    updating index values in the two-dimensional bitmap based on the encoded character or word.

5. An encoding method to be executed by a computer, the method comprising:
    reading text data of an encoding target using a processor;
    determining appearance positions of each word in the text data as a two-dimensional bitmap in which each row corresponds to a word of the text data and each column corresponds to a position in the text data, the appearance position of each word being indicated by an index value at an intersection of a corresponding row and column of the bitmap;
    determining strings of words in the text data by shifting a row relative to a subsequent row and performing an AND operation between index values in each column of the row and the subsequent row to determine columns that result in non-zero values of the AND operation, the columns that result in non-zero values indicating that a word corresponding to the row and a word corresponding to the subsequent row appear as a string of words at positions corresponding to the columns that result in non-zero values;
    encoding each character or word in the text data by using results of the determining of the appearance positions and the determining of the strings of words; and
    updating index values in the two-dimensional bitmap based on the encoded character or word using the processor.

* * * * *